(12) United States Patent
Summers et al.

(10) Patent No.: US 8,847,373 B1
(45) Date of Patent: Sep. 30, 2014

(54) EXOTHERMIC ACTIVATION FOR HIGH VACUUM PACKAGING

(71) Applicants: Jeffery F. Summers, Santa Barbara, CA (US); Christopher S. Gudeman, Lompoc, CA (US); Jaquelin K. Spong, Falls Church, VA (US)

(72) Inventors: Jeffery F. Summers, Santa Barbara, CA (US); Christopher S. Gudeman, Lompoc, CA (US); Jaquelin K. Spong, Falls Church, VA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 13/986,467

(22) Filed: May 7, 2013

(51) Int. Cl.
*H01L 23/20* (2006.01)
*H01L 23/02* (2006.01)
*H01L 23/26* (2006.01)

(52) U.S. Cl.
CPC .................................... *H01L 23/26* (2013.01)
USPC ................... 257/682; 257/686; 257/E23.085

(58) Field of Classification Search
USPC .................................... 257/682, 686, E23.085
See application file for complete search history.

(56) References Cited

U.S. PATENT DOCUMENTS

| | | | | |
|---|---|---|---|---|
| 4,622,433 A * | 11/1986 | Frampton | ...................... | 174/539 |
| 6,436,853 B2 * | 8/2002 | Lin et al. | ...................... | 438/800 |
| 7,833,880 B2 * | 11/2010 | Rizzi | ............................. | 438/456 |
| 7,972,683 B2 * | 7/2011 | Gudeman et al. | ............. | 428/208 |
| 8,304,965 B2 * | 11/2012 | Aratake et al. | ................. | 310/344 |
| 2005/0151457 A1 * | 7/2005 | Schrijvers et al. | ............ | 313/461 |
| 2005/0238908 A1 * | 10/2005 | Hikmet et al. | ................ | 428/690 |
| 2007/0048887 A1 | 3/2007 | Erlach et al. | | |
| 2007/0048898 A1 | 3/2007 | Carlson et al. | | |
| 2007/0114643 A1 * | 5/2007 | DCamp et al. | ................ | 257/678 |
| 2007/0172991 A1 * | 7/2007 | Schaadt | ........................ | 438/123 |
| 2008/0278268 A1 | 11/2008 | Foster et al. | | |
| 2009/0001537 A1 | 1/2009 | Summers | | |
| 2011/0169584 A1 * | 7/2011 | Fukuda | ......................... | 331/158 |
| 2012/0068300 A1 * | 3/2012 | Summers | ...................... | 257/531 |
| 2013/0105959 A1 * | 5/2013 | Baillin et al. | ................. | 257/682 |
| 2013/0278359 A1 * | 10/2013 | Stephanou et al. | ........... | 333/232 |
| 2014/0037870 A1 * | 2/2014 | Petrmichl et al. | ............... | 428/34 |
| 2014/0191341 A1 * | 7/2014 | Chu et al. | ...................... | 257/415 |

* cited by examiner

*Primary Examiner* — Ida M Soward
(74) *Attorney, Agent, or Firm* — Jaquelin K. Spong

(57) ABSTRACT

An approach to obtain localized heat within a sealed vacuum cavity is disclosed. The approach uses an exothermic reaction between two reactants to generate heat in the vicinity of a structure, such as a getter material or a bondline that is heat activated. The exothermic reaction can be initiated by application of laser light, or application of current to a current-carrying conductor in the vicinity of the reactants.

11 Claims, 15 Drawing Sheets

EXOTHERMIC ACTIVATION FOR HIGH VACUUM PACKAGING

CROSS REFERENCE TO RELATED APPLICATIONS

This application is a continuation-in-part of U.S. patent application Ser. No. 13/137,883 filed Sep. 20, 2011, and incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to a microdevice enclosed in an evacuated cavity.

Deposition techniques for thin layers used in semiconductor and MEMS devices often have gases incorporated in the layers during deposition. These devices may then be encapsulated in an evacuated cavity for proper functioning. However, the gases incorporated in the films may escape from the layers during the devices' lifetimes, raising the pressure in the evacuated cavities. Accordingly, many designs include a "getter" material, a reactive, generally metal layer, whose purpose is to absorb these gases, and maintain the vacuum levels within the package. Because of the reactive nature of these materials, they also tend to oxidize at the surface, forming an oxide layer that must be removed in order to activate the getter.

Current packaging techniques for vacuum-encapsulated packages require high temperatures, in excess of 400 degrees Centigrade to activate the getters. At this temperature, the oxide layers are generally driven into the bulk of the getter material, leaving the surface relatively clean and able to absorb additional impurity gases. These temperatures are consistent with those required to fuse glass frit, which is often used for vacuum encapsulation, because the melting temperatures simultaneously fire, or activate, the getter.

However, these high temperatures are incompatible with many of the materials and structures included in these devices, which cannot withstand these temperatures without melting or evaporating. Thus, the encapsulation of many small, delicate devices in a sealed vacuum cavity remains an unresolved problem, because there is presently no way to activate the getter without exposing the devices to high (>400 C) temperatures.

SUMMARY

Proposed here are systems and methods which are capable of applying localized heating to structures sealed in a device cavity. The structures may be, for example, a getter material or a bonding adhesive material. Both require heat to be activated to perform their function.

One embodiment includes the activation of getter after packaging the device with a low temperature bonding process (e.g., indium). The getter is fired or activated by depositing a magnetically permeable material underneath the getter material or bonding adhesive. This material may be heated by inductive coupling to an RF field, and joule heating of the magnetically permeable material by the induced current.

The getter may be fired by placing the die or wafer in or near an RF coil and then inductively heating the magnetic material. The coil may generate an alternating magnetic field within the coil or along its axis. The field lines of this alternating field are then gathered within the permeable magnetic material as is well known from magnetostatics. The alternating field within the magnetically permeable material generates an alternating current within the magnetically permeable material, which in turn, heats the magnetically permeable material by Joule heating.

Because the getter is deposited over the magnetic material and is in direct contact with the magnetically permeable material over much of its surface, the heat would flow by conduction specifically into the getter material, heating it preferentially to the rest of the device, which would remain at a relatively low temperature. To increase the efficiency of this heat transfer, the magnetic material may be suspended over a cavity or void formed beneath it, reducing the heat leakage into the substrate thereby.

Another embodiment includes the activation of getter material or binding adhesive using an exothermic reaction to generate heat in a specific area. As with the inductive approach, the getter or adhesive can be activated after packaging the device in a device cavity. Because the heat is localized, the method is compatible with a low temperature bonding process (e.g., indium). The exothermic reaction may be between two reactant metal layers deposited under the getter or adhesive material. The heat produced by the exothermic reaction is sufficient to activate the getter by driving the oxide coating into the interior of the getter material, or by melting or curing the adhesive. The metal layers and getter materials may be either be suspended over an empty cavity or deposited over an insulating layer in order to retain the heat produced within the desired volume.

Several embodiments of this idea are described below, as examples of the inventive concept.

BRIEF DESCRIPTION OF THE DRAWINGS

Various exemplary details are described with reference to the following figures, wherein.

DETAILED DESCRIPTION

Figure 1:
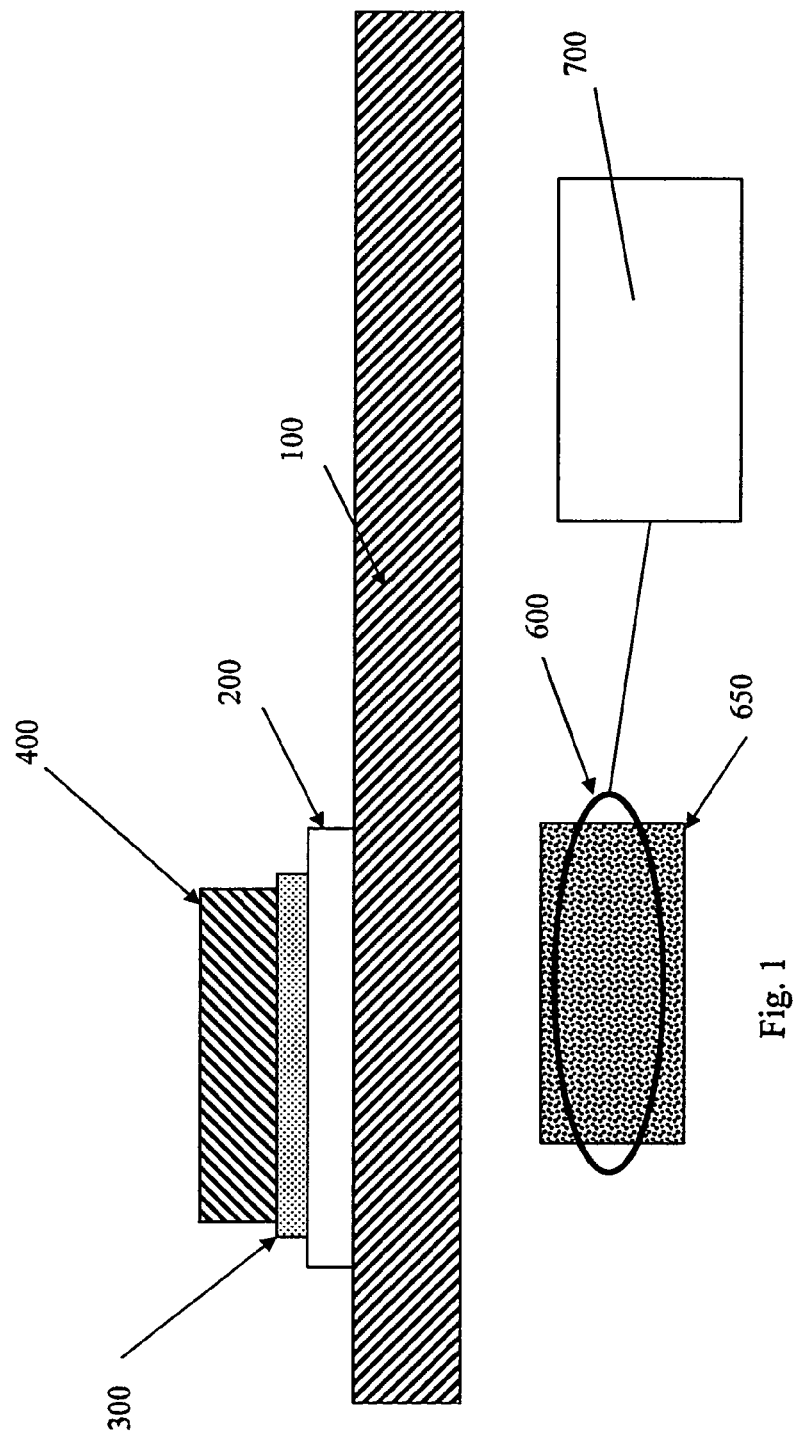
FIG. 1 is a cross sectional diagram of the magnetic getter firing approach.

The systems and methods described herein may be particularly applicable to the manufacture of microdevices, wherein the manufacturing process makes use of a low temperature bonding methodology, such as a metal alloy bond. The microdevices may be, for example, MEMS devices formed on a semiconductor substrate. Alternatively, they may be integrated circuit devices formed on a semiconductor substrate.

As mentioned previously, most vacuum encapsulated devices have used a glass frit adhesive to bond two substrates together, wherein the substrates define an evacuated device cavity in the wafer assembly that encloses a microdevice. The glass frit provides a hermetic seal around the device cavity, maintaining the vacuum therein. However, glass frit requires high melting or bonding temperatures, which may destroy the delicate structures of the microdevice. These high temperatures are also needed to activate the getter enclosed in the device cavity. Therefore, if using a lower temperature bonding method, some other means must be devised for activating the getter which requires the higher temperatures.

Many devices and especially so-called microelectromechanical systems (MEMS) devices, have delicate structures which cannot withstand these 400+ degree centigrade temperatures. For these devices, a lower temperature bond may be used, for example, a metal alloy bond such as that described in U.S. patent application Ser. No. 11/211,622, filed Aug. 26, 2005 and U.S. patent application Ser. No. 11/304,601, now U.S. Pat. No. 7,569,926. Each of these documents is incorporated by reference in their entireties. For such applications, the getter must be fired some other way than raising the temperature of the wafer assembly to 400+ degrees centigrade. Furthermore, the getter must be activated within a vacuum cavity, for example within the wafer bonding chamber, and that vacuum maintained in order to avoid the reformation of the passivation layer over the getter surface. This may be done by, for example, heating the lid wafer only within an evacuated bonding chamber, and then bonding the lid wafer to the device wafer in the bonding chamber. However, the bonding material is generally already placed on the lid wafer before insertion in the bonding chamber, thus requiring a bonding technology to withstand the high temperatures. If a low temperature metal alloy bonding material is used on the lid wafer, these metal films may be melted, damaged or degraded by the heat.

Accordingly, to date, there has been no way of using a low temperature bond with a device requiring a getter, which has greatly inhibited the development of such devices. There are, indeed, many such devices such as infrared imaging devices or bolometers, which because of their need for an evacuated operating environment, require getters, but their delicate structures cannot withstand high temperatures, and thus they require a low temperature bond.

The problem may be addressed by applying the heat locally and specifically, using the techniques described herein. This technique is consistent with bonds that may be formed at low temperature, for example using metal alloy bonds as described in the '926 patent. These materials form a hermetic seal at temperatures less than about 250 degrees centigrade.

One embodiment of the local heating method may make use of an inductively coupled, magnetically permeable layer disposed on a substrate and directly beneath and in direct contact with an overlying getter layer. It should be understood that any conductive material will generate eddy currents, but this effect can be greatly amplified by using a permeable magnetic material, which effectively amplifies the magnetic flux. Furthermore, because metal materials will all respond similarly, using a permeable material allows heating of that material preferentially, leaving other conductive structures relatively unaffected. This magnetically permeable material is inductively coupled to an external RF coil which generates an RF changing magnetic field. The changing field generates eddy currents in the magnetic material, which heats the material by Joule heating. The heat thus produced in the magnetic layer may be isolated from the underlying substrate by a void or cavity, thus minimizing the flow of heat into this heat sink and restricting it largely to the magnetic layer. The heat may then be transferred by conduction to the overlying getter layer, heating and thus activating the getter. Because the heat is isolated to the magnetic and getter layers, the remainder of the wafer and device may remain relatively cool. The technique may be applied to encapsulated, singulated, individual devices, or it may be applied to the entire wafer before or after bonding.

FIG. 1 is a cross sectional view of a portion of the system and method. A supporting substrate 100 will be used to support the structure. Substrate 100 may be silicon, glass, ceramic, or any other convenient material that is consistent with lithographic processing. An insulating material 200 may be deposited or formed over the substrate 100. The insulating material may serve as electrical isolation between the conductive magnetic material and the possibly conductive substrate 100. The insulating material 200 may be, for example, an oxide such as a layer of silicon dioxide grown or deposited over the surface of a silicon substrate 100.

A magnetic material 300 is then formed or otherwise deposited over the insulator 200. The magnetic material may be, for example, iron (Fe), nickel (Ni), cobalt (Co), neodymium (Nd) and manganese (Mn), or their compounds, such as nickel-iron permalloy (80% Ni, 20% Fe). This layer may be deposited by, for example, sputter deposition to a thickness of several microns. The preferred thickness will depend on the details of the application, such as the amount of heat required to fire the getter, its thickness and extent, and the rate of heat loss to surrounding areas and structures. In one embodiment, the magnetic layer is preferably about 3 um thick, but may be anywhere from 0.5 to 20 um thick, and may depend on the size of the device cavity. Preferably, this material 300 may have a permeability of between about 1 T to 20 T.

Although in theory, any conductive material would respond to the changing magnetic field, use of the magnetically permeable material may amplify the field strength, and thus the magnitude of the eddy current, by many fold, and is thus preferred.

The getter material 400 may then be deposited over the magnetic material 300. The getter material is typically a reactive metal or metal alloy, such as, for example, an alloy of zirconium (Zr), vanadium (V), and iron (Fe) as that described in U.S. patent application Ser. No. 11/819,338, incorporated by reference in its entirety. The getter material 400 may be deposited over the entire surface of the wafer, or it may be localized to certain areas by patterning. This patterning step may pattern the underlying magnetic layer at the same time. The getter material may be 0.2-3 microns thick and extend over about a 3-4 micron area As described previously, the getter material 400 may be fired, that is, activated, by heating the getter material 400 to a temperature at which its passivation layer is driven off. Typically, this passivation layer is an oxide which forms over the surface of the getter material 400 when the getter material 400 is exposed to an atmosphere. The temperatures required for activation depend on the material, but are typically several hundred degrees Centigrade. For the zirconium/vanadium alloy mentioned above, this temperature may be about 450 C. Using the method described here, this temperature may be achieved in the getter material 400, while the rest of the structure remains relatively cool.

A power supply 700 is used to generate an RF signal which is applied to a coil 600 as shown in FIG. 1. The signal generates a changing magnetic field along its axis, as is well known from fundamental electromagnetism. This changing field then couples into the magnetically permeable material 300, driving eddy currents in the magnetically permeable material 300. The power dissipated by the eddy currents is proportional to the square of the flux density within the material, thus having the material be magnetically permeable greatly improves the efficiency of this approach. These eddy currents may then heat the material through simple Joule heating. The magnitude and frequency of the RF signal needed to heat the getter to 450 degrees Centigrade may be about 200 W and 40 kHz. It should be understood that these values are exemplary only, and the values used in a particular application may depend on the details of that application. Values in the range 1 W-100 W and 1 kHz-100 kHz may be appropriate, or any other values sufficient to heat the getter enough to activate its surface are anticipated.

The coil may also be wrapped around a core of permeable magnetic material 650 which will also dramatically increase the magnetic flux produced. This core 650 may be, but need not necessarily be, the same material as magnetically permeable material 300. A core permeability of between about 10 and 20 T may be suitable. This core may be a composition including iron (Fe), nickel (Ni), cobalt (Co), neodymium (Nd), manganese (Mn) or their alloys. The coil may be brought into proximity to the magnetic layer, but need not be in contact or coupled to the wafer either mechanically or electrically. The coil may be conveniently brought to a distance of about 1 cm to the magnetic layer, or even closer. Upon energizing the coil, the temperatures in the magnetic layer may rise rapidly, activating the getter within minutes or even seconds. Since the getter is already enclosed in the evacuated device cavity, it begins functioning immediately, and no further processing is needed. The wafer can then be singulated if the devices have not yet been separated.

Figure 2:
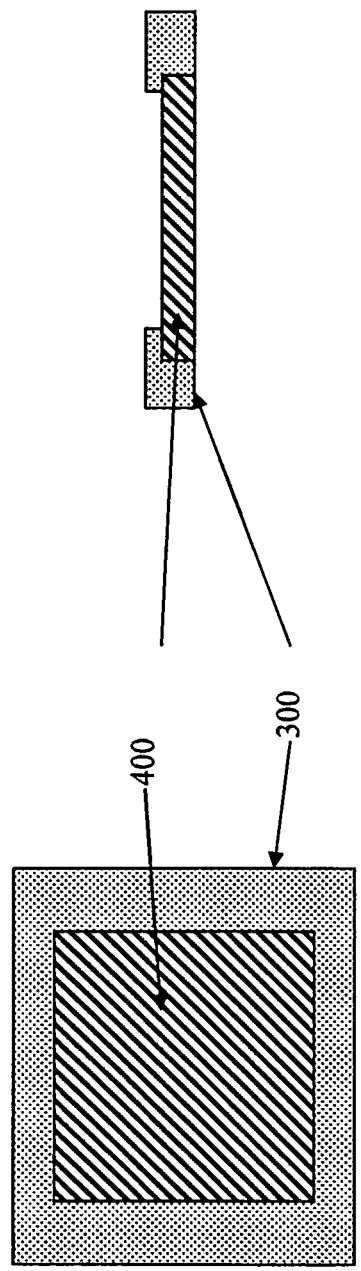
FIG. 2 is a cross sectional diagram of an alternative magnetic getter firing approach.

FIG. 2 is a plan view diagram of the device shown in FIG. 1. As shown in FIG. 2, the dimensions of the magnetic layer 300 may exceed those of the getter layer 400, so that the magnetic layer 300 may be in the form of a picture frame around the getter layer 400. This may assure that the edges of the getter layer 400 are effectively activated, as well as the interior regions. The amount of overhang need not be large, for example a fraction of a micron may be sufficient, in the range 0.1-1.0 um.

RF inductive heating is well known, but to the inventor's knowledge, has yet to be used to fire a getter within a device cavity. The silicon and most materials in MEMs devices are non-magnetic so this process is effective on the magnetic material but does not affect or heat any other structure. The process can be used for any discrete or wafer-level device that is not packaged in a magnetic material, which includes the vast majority of microdevices.

The getter material may not necessarily be formed using a thin film deposition techniques. Instead, it could be formed by silk screening, spraying or other methods. The getter material may be deposited in bead form, packed into the cavity, with a very large resulting surface area, giving it almost unlimited pumping capacity.

Figure 3:
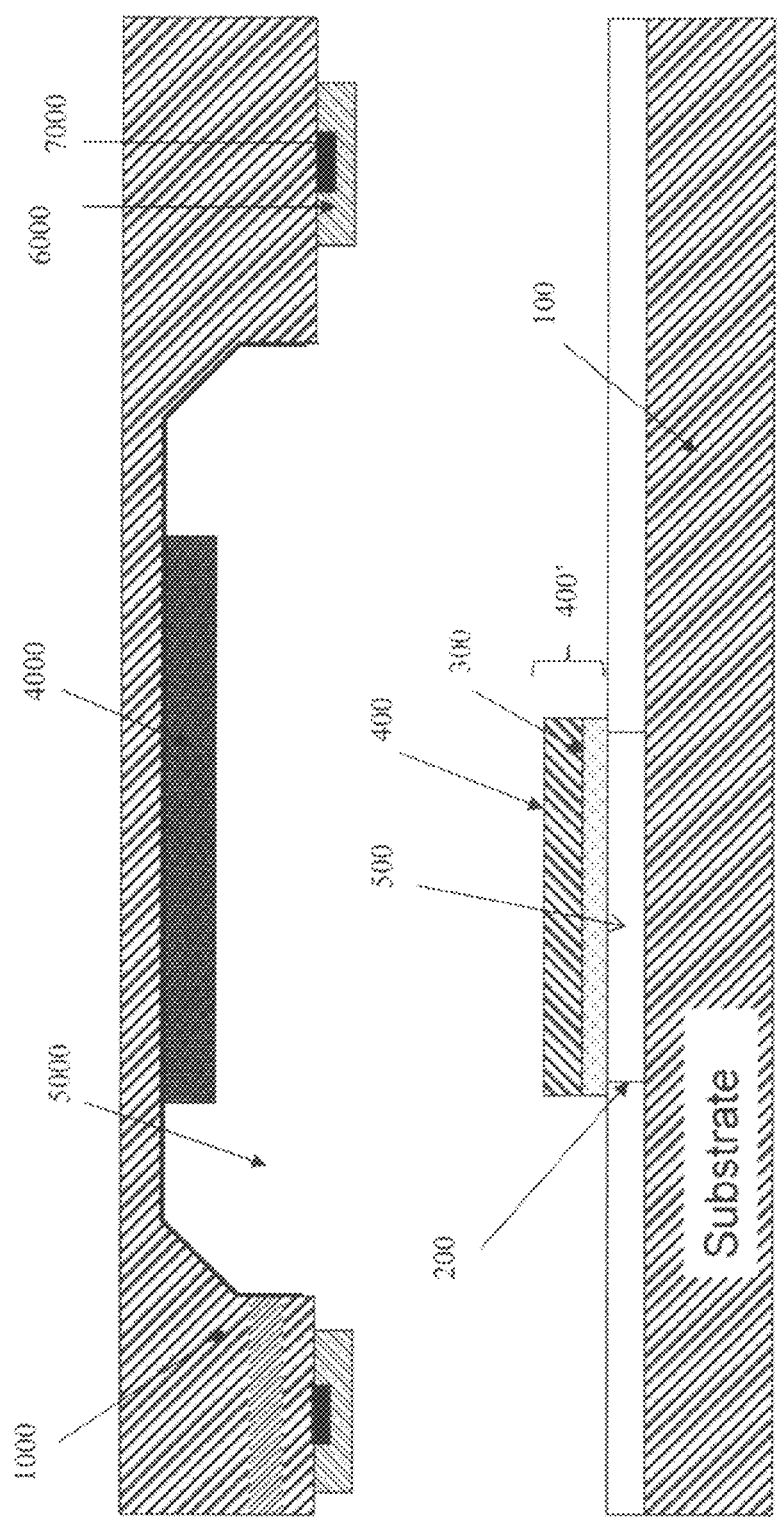
FIG. 3 is a cross sectional diagram of an alternative magnetic getter firing approach.

FIG. 3 shows the application of this technique to the packaging of a microdevice 4000 in an evacuated device cavity 5000 with a getter 400. The microdevice may be, for example, a switch such as that described in U.S. patent application Ser. No. 11/797,924 filed May 9, 2007 and incorporated by reference in its entirety. The metal layers of this device may be unable to withstand the temperatures needed for glass frit bonding. Alternatively, the device may be an infrared emitting or infrared detecting device such as that described in U.S. Pat. No. 7,687,304 or U.S. Pat. No. 7,968,986, both incorporated by reference in their entireties, and assigned to the same assignee as the present invention.

Accordingly, a low temperature bond may form a sealed vacuum cavity that encloses a microdevice. Suitable low temperature bonds are described in the incorporated '622 and '601 applications.

The device wafer 1000 or the lid wafer 100 may have the low temperature bonding material 6000 formed in a perimeter around the microdevice 4000. This bonding material may be combined with a raised feature 7000 as is described more fully in U.S. Pat. No. 7,569,926 and U.S. Pat. No. 7,960,208, incorporated by reference in their entireties, and assigned to the same assignee as the instant application. After bonding the lid wafer 100 to the device wafer 1000 in an evacuated bonding chamber, the wafer assembly may be removed from the bonding chamber. The getter material 400, now encapsulated in the device cavity 5000 with the microdevice 4000, may be activated as described above. The getter may be fired using this inductive procedure either before or after bonding the lid wafer to the device wafer, but to avoid installing the coil in the bonding chamber, the getter material may be activated after bonding to the device wafer and removal from the bonding chamber. The process may be conducted on either individual devices after singulation, or on the entire wafer before singulation. As shown in FIG. 3, a cavity 500 may be formed under the magnetic layer 300, by etching away the insulating layer 200 in this region. The cavity may be devoid of solid material under a substantial portion of a surface of the magnetic layer 300. This "substantial portion" may be, for example, 75% or more of the surface of the magnetic layer. This cavity may be evacuated during wafer bonding and subsequent getter activation. The presence of the cavity 500 beneath the magnetic layer may provide thermal isolation to the magnetic layer, such that the heat generated in the magnetic layer 300 is available for firing the getter layer 400, rather than being drawn into the thermal sink of the substrate 100. The cavity 500 may be formed by wet etching, for example, by applying an etchant such as potassium hydroxide (KOH) to the insulation layer 200 and etching the cavity in the insulation layer 200. Various techniques for performing such etching are described further below with respect to FIGS. 5 and 6.

Figure 4:
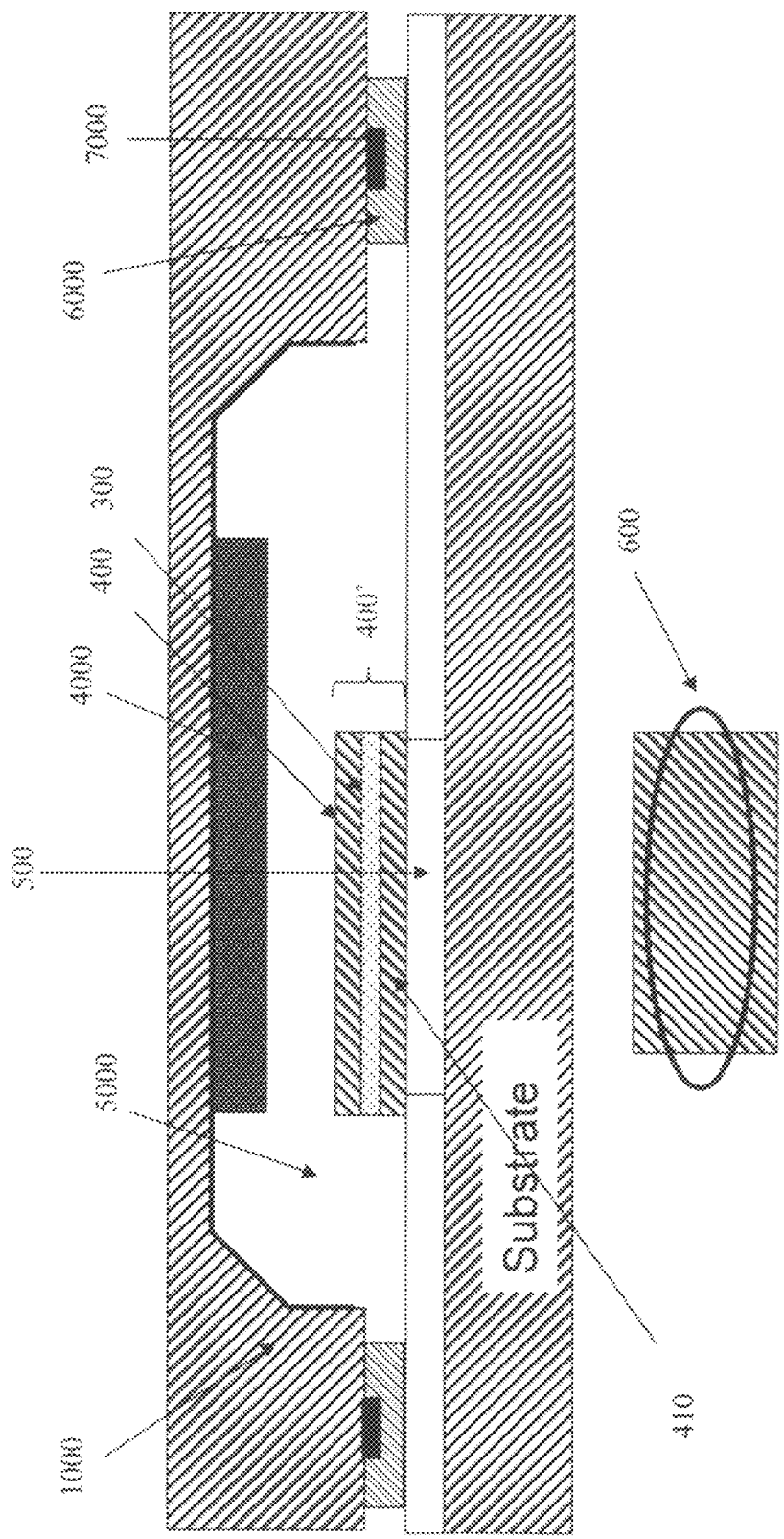
FIG. 4 is a plan view of the magnetic getter firing approach.

FIG. 4 shows another embodiment of the concept described above. In this embodiment, a first layer of getter material 410 is deposited before the magnetic material 300. The magnetic material 300 is then deposited as before. A second layer of getter material 400 is then deposited over the magnetic material 300 as in the previous embodiment. The multilayer stack 300-410, now referred to as 400', may then be patterned. A cavity 500 may then be formed beneath the stack 400' by any of the techniques described below with respect to FIGS. 5 and 6. By properly forming the cavity 500 beneath the multilayer stack 400', two surfaces of getter material, layers 410 and 400, are now in fluid communication with the device cavity 5000. As before in FIG. 3, the cavity 500 may be devoid of solid material under a substantial portion of a surface of the magnetic layer 300. This "substantial portion" may be, for example, 75% or more of the surface of the magnetic layer. The cavity 500 thus exposes the surface of the lower getter layer 410 to the environment of the device cavity 5000, thereby approximately double the gettering capability within the device cavity.

Figure 5:
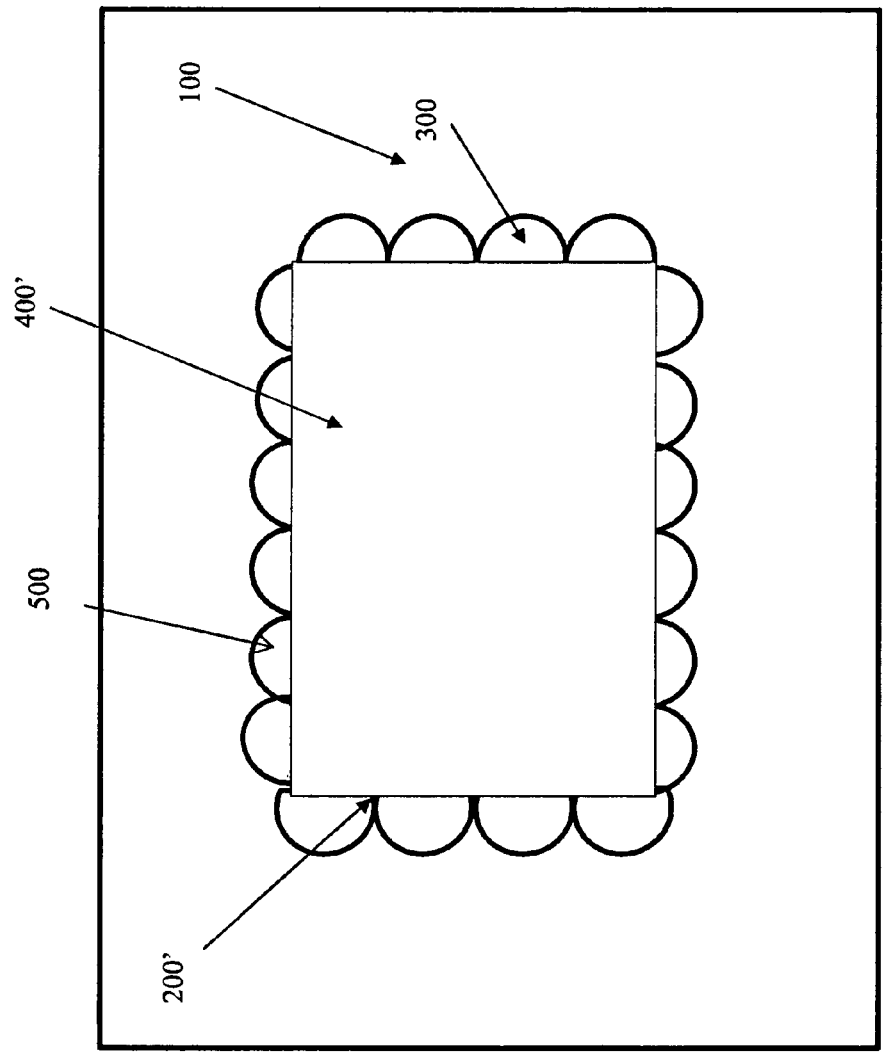
FIG. 5 is a plan view of an alternative embodiment of the magnetic getter firing approach.

FIG. 5 is a simplified plan view of one approach to implementing the multilayer stack 400' over a cavity 500 in fluid communication with device cavity 5000, as was shown in FIGS. 3 and 4. The insulating layer, having been formed uniformly over the surface of the substrate 100, is patterned with an outline of areas to be removed. For example, a hard mask may be patterned to cover areas of the insulating layer which are to be maintained, and then uncovered in areas to be removed. Reference number 200' now corresponds to the boundary of the insulating layer after patterning. This boundary may have an extent that partially underlies the magnetic layer, such that it can provide support to the overlying magnetic and/or getter layer. For example, the clamshell pattern shown in FIG. 5 may be used, such that narrow projections 200' of the insulating layer remain under the magnetic layer 300 or getter layer 400, in order to provide support for these structures. The magnetic layer 300 and getter layer 400 are thus freely suspended over much of the area of the cavity 500. However, these projections may be narrow, and not impede to any meaningful degree the passage of gases into and out of the cavity 500. The clamshell pattern shown in FIG. 5 is but one example of such an outline. As this outline is lithographically formed, it may be formed in any arbitrary or complex shape. The cavity 500 may be formed by allowing a liquid etchant, such as potassium hydroxide (KOH) to be applied to the areas not covered by the hard mask. The cavity may be formed after the magnetic layer 300 and getter layer 400 are formed in the regions shown, and the liquid etchant may be introduced to the cavity through the remaining holes 200'.

Figure 6:
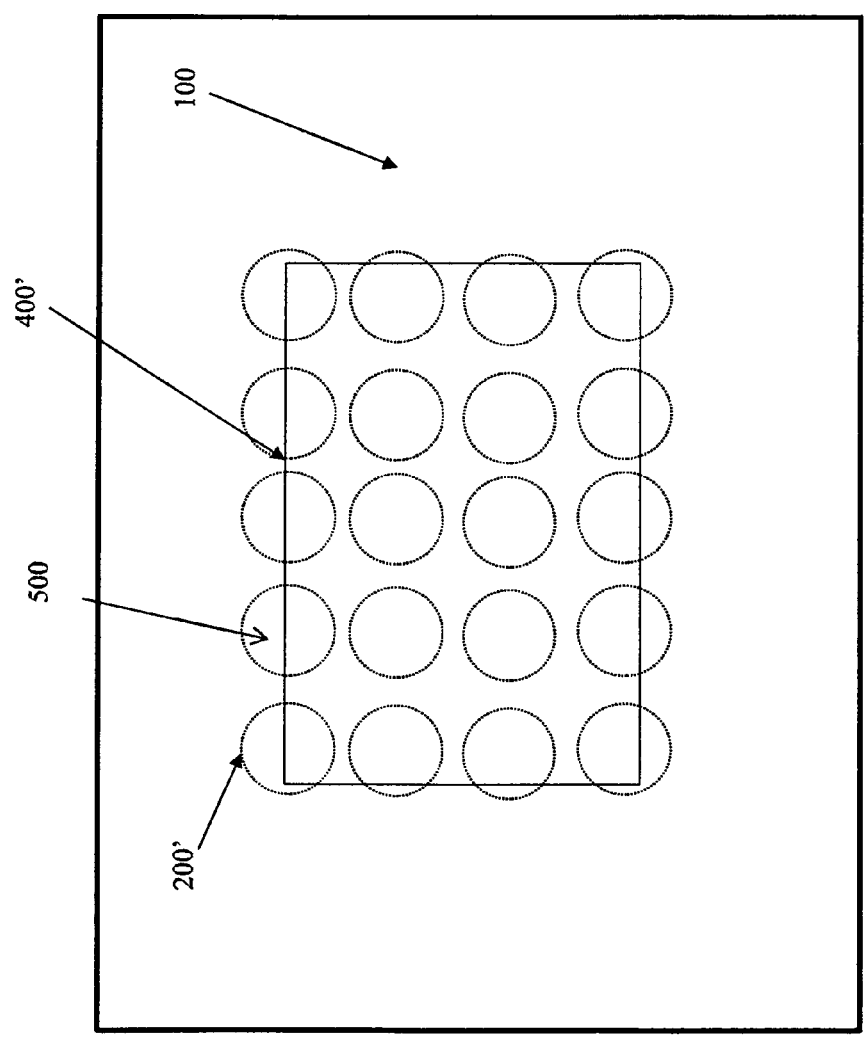
FIG. 6 is a plan view of an alternative embodiment of the magnetic getter firing approach.

Another example of a similar approach is shown in FIG. 6. FIG. 6 is a simplified plan view of the insulating layer 200 in which an array of holes 200' has been lithographically formed. The holes may allow alloy an etchant to be introduced which will remove substrate material 100 beneath and between the holes. Additional detail directed to this approach is disclosed in U.S. Pat. No. 7,785,913, which is assigned to the same assignee as the present application. By providing a sufficient amount of time for the etchant to remove the substrate material 100, the removal will leave a cavity 500 beneath and between the holes which allows the free flow of gases to this region. The formation of this cavity 500 thus allows exposure of the lower getter layer 410 to the environment of the device cavity 5000. The lands between the holes 200' provide support to the overlying layers of magnetic and getter materials.

Although these two embodiments are but two of a large number of possible approaches to achieving the support of the getter material in a multilayer a stack 400', while allowing exposure of the stack 400' to the environment of the device cavity 5000. Each of these approaches has at least a portion of material that supports an overlaid material suspended over a cavity 500. The environment of the cavity 500 is in fluid communication with the device cavity 5000 that encapsulates the device.

Figure 7:
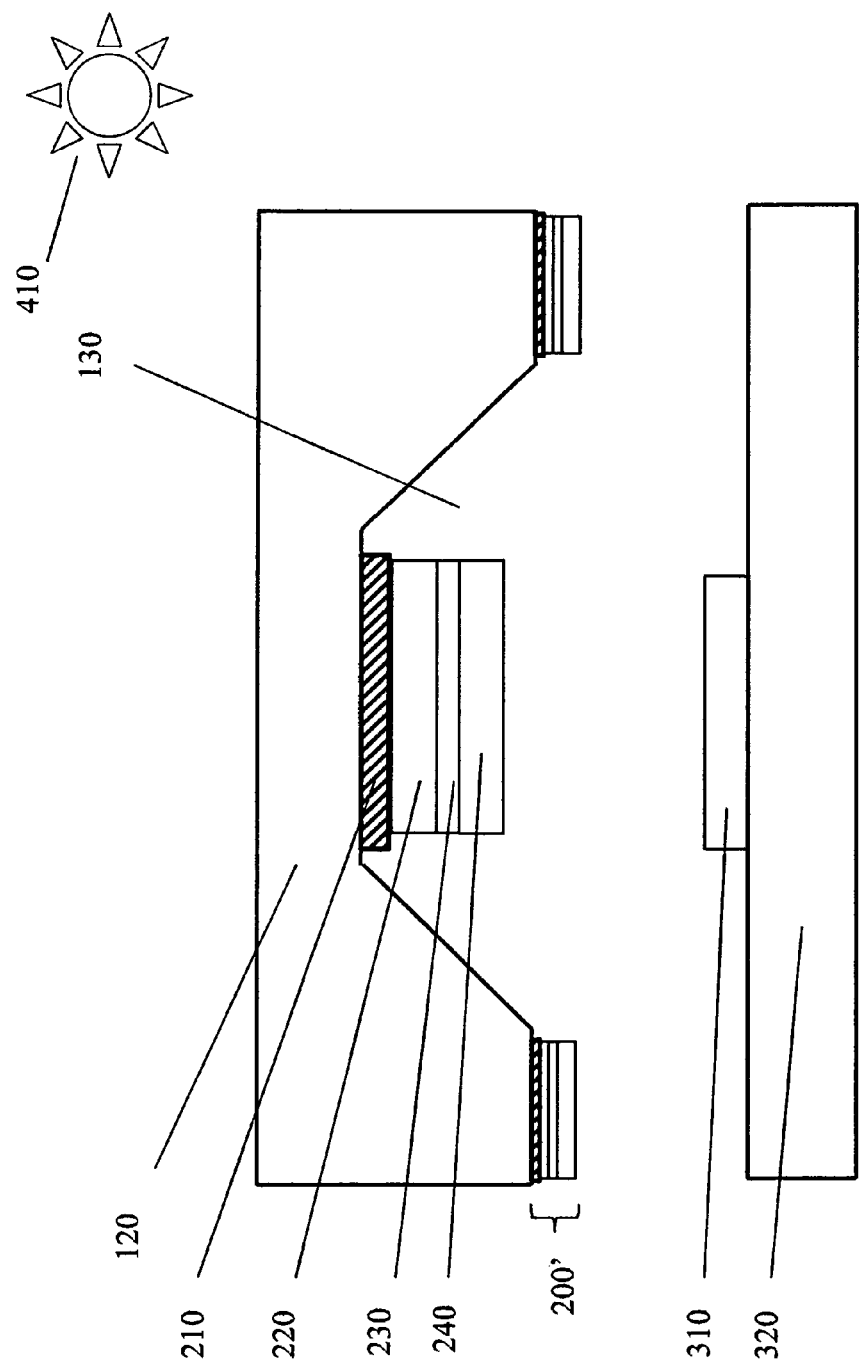
FIG. 7 is a cross sectional diagram of an alternative localized heating approach using exothermic reactants.

FIG. 7 shows another exemplary embodiment of a system for applying heat to a localized area, which does not use a coil or a magnetically permeable material necessarily. The approach illustrated in FIG. 7 uses an exothermic reaction between a first reactant 220 and a second reactant 230 to produce localized heat. The reactants may be two metal layers 220 and 230, for example, or a metal layer 220 and a metal oxide layer 230. An energy barrier may keep the reactants 220 and 230 from reacting prematurely, until initiated by supplying this amount of energy. The reaction may then proceed, producing another material that is some combination of the first reactant and the second reactant. These layers may be disposed underneath a heat-activatable material 240, such as a getter material or an adhesive material. Underneath the layer stack 220-240 may be a current-carrying conductor 210.

A "heat-activatable material" should be understood to mean a material which becomes functional after a heating phase. For example, an glass frit adhesive becomes functional in providing a hermetic seal after being heated to the fusing temperature of the frit. A getter material becomes active after heating to its activation temperature. In contrast, an "activated material" is a material in its final, temperature stable state, and does not undergo further transformations throughout the manufacturing process or the lifetime of the device. A "product material" is a compound formed during the exothermic reaction, and is generally some combination of reactant 1 and reactant 2.

When current is applied to the current-carrying conductor 210, the heat generated within the conductor may be sufficient to initiate the exothermic reaction between layers 220 and 230. As an alternative to the current-carrying conductor 210, the reaction may be initiated by irradiating the layers 220 and 230 with a laser 410. The laser light may provide sufficient energy to initiate the exothermic reaction.

Upon initiation, one layer 220 of the first reactant may react with the second layer of the second reactant to form at least one reaction product and heat. The amount of heat produced may depend on the reaction, but may be substantial. In one exemplary embodiment, the amount of heat produced is sufficient to cause the activation of the activatable material 240. For example, if activatable material 240 is a getter material, the heat may be sufficient to drive the oxide passivation layer into the bulk of the getter material 240. This may clear the surface of activatable material 240 and enable it to perform its gettering function in the device cavity.

In another exemplary embodiment, the activatable material 240 may be a bonding adhesive which bonds a first wafer to a second wafer to form the device cavity therebetween. This embodiment is illustrated schematically also in FIG. 7. The wafer stack is shown in aggregate as 200', and should be understood to comprise similar or identical layers 220, 230 and 240, and optionally 210 as well. However, this wafer stack may be disposed within or under the bondline rather than in the device cavity 130. When the first wafer 120 is brought into contact with the second wafer 310 in the bonding position, a reaction between the first layer 220 and the second layer 230 may be initiated. The initiation may be brought about by heat from a current-carrying conductor 210 or by a laser 410, for example. The heat produced by this reaction may be enough to cure or melt the adhesive material 240, thereby bonding the first wafer 120 to the second wafer 320.

Having described the functioning of the localized exothermic heating concept, the description will now turn to manufacturing methods for the structure, and exemplary materials and dimensions will be provided.

To form the structure, a first substrate may be provided of a suitable material, for example silicon or ceramic. If a current-carrying conductor is to be formed on the substrate, a suitable insulating layer may be provided between the conductor 210 and the substrate 120. The current-carrying conductor may be, for example, gold which can be sputter deposited in a thin layer 210 over the surface of the substrate 120. The current-carrying conductor 210 may be patterned (in plan view) in order to achieve certain thermal properties. Such embodiments are described in more detail below.

Figure 8:
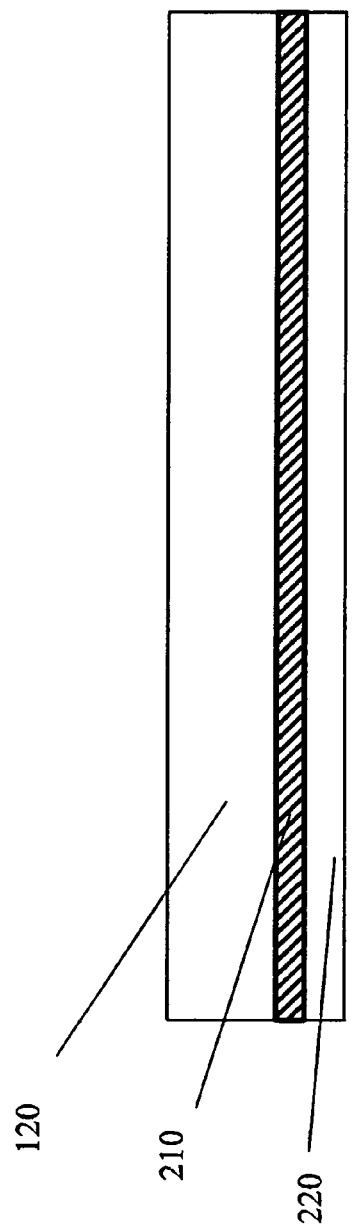
FIG. 8 is a cross sectional diagram illustrating a method of manufacturing an alternative localized heating approach using exothermic reactants.

Following the formation of the optional current-carrying conductor 210, a first layer 220 of a first reactant many be formed in a thin sheet over the current-carrying conductor. The first reactant may be, for example, a nickel (Ni), iron oxide ($Fe_2O_3$) or copper oxide (CuO). This layer may also be sputter deposited or formed by chemical vapor deposition (CVD). The thickness of the first layer of the first reactant may be, for example, between about 1 micron and 100 microns. The thickness may be chosen depending on the thickness of the activatable material 240 to follow, the amount of heat produced by the reaction, and the amount of heat needed from the reaction with the second reactant. The structure at this point is shown in FIG. 8.

Figure 9:
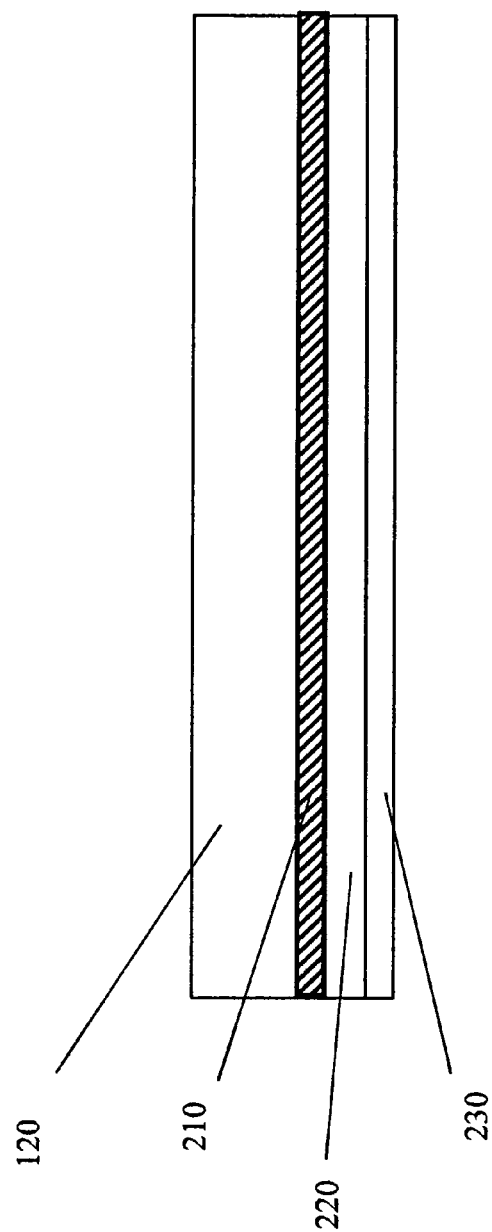
FIG. 9 is a cross sectional diagram illustrating a method of manufacturing an alternative localized heating approach using exothermic reactants.

Following formation of the first layer 220 of the first reactant, a second layer 230 of a second reactant may be formed. This layer may be, for example, aluminum. The thickness of the Al layer may be, for example, between about 1 micron and 100 microns. This layer 220 may also be sputter-deposited. The thickness may be chosen depending on the thickness of the activatable material 240 to follow, the amount of heat produced by the reaction, and the amount of heat needed from the reaction. The structure at this point is shown in FIG. 9.

Following deposition of the second layer 230, the activatable material 240 may be formed over the second layer of the second reactant 230. As described above, the activatable material may be, for example, a zirconium/titanium/vanadium getter material, well known in the art. Alternatively, the activatable material may be a bonding material such as a glass frit or a metal alloy. The metal alloy may include gold (Au) and indium (In). Such metal alloy bonds are known as solid/liquid diffusion bonds (SLID) and are described more fully in U.S. Pat. No. 8,288,211 issued Oct. 16, 2011 and incorporated by reference in its entirety.

Figure 10:
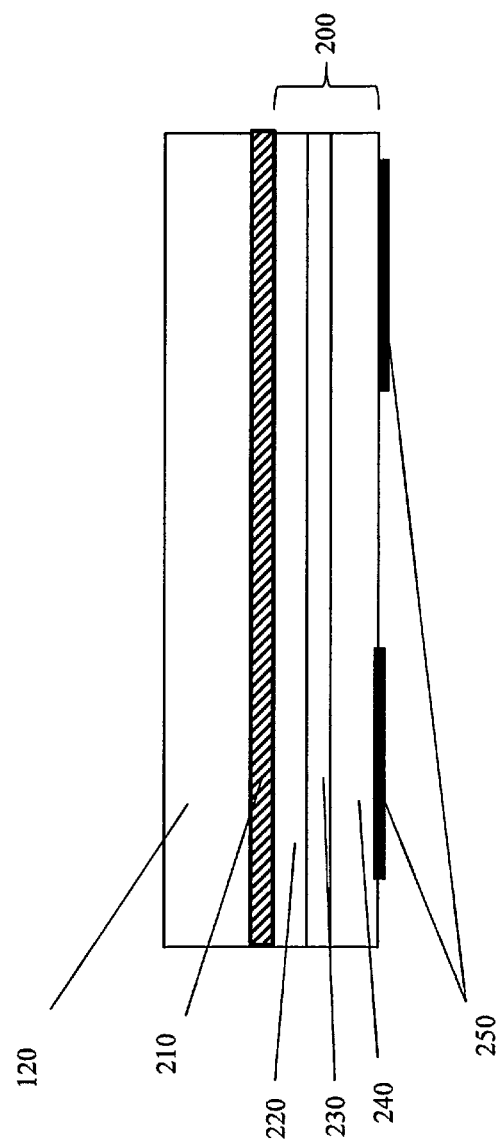
FIG. 10 is a cross sectional diagram illustrating a method of manufacturing an alternative localized heating approach using exothermic reactants.

After deposition of the final layer, the activatable layer 240, a hard mask 250 may be patterned over the multilayer stack. The hard mask may be a material such as a nitride which is largely impervious to the etching mechanism to follow. The hard mask 250 will protect the layers underneath it, current carrying layer 210, first reactant layer 220, second reactant layer 230, and activatable material 240, henceforth referred to as multilayer stack 200. The etching mechanism is then applied to the multilayer stack 200 shown in FIG. 10. The etching mechanism may be any appropriate thin film material removal technique, such as sputter etching, plasma etching, chemical or liquid anisotropic etching for example. These techniques are well known in the art.

Figure 11:
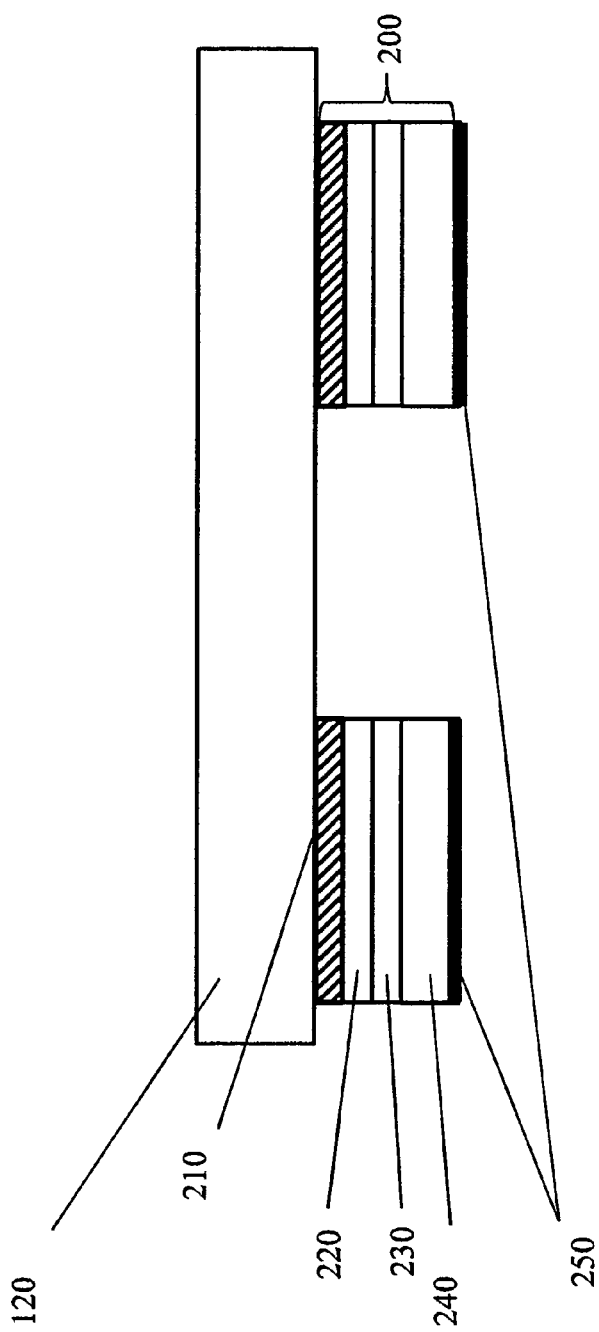
FIG. 11 is a cross sectional diagram illustrating a method of manufacturing an alternative localized heating approach using exothermic reactants.
Figure 12:
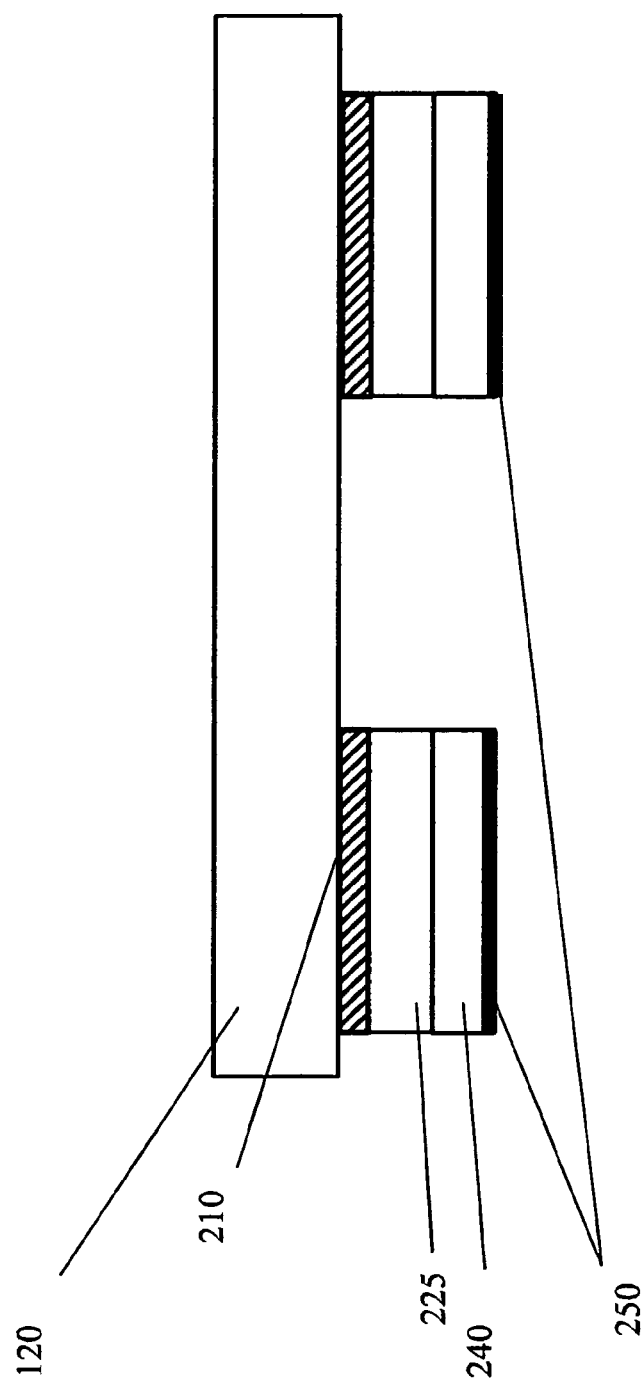
FIG. 12 is a cross sectional diagram illustrating a method of manufacturing an alternative localized heating approach using exothermic reactants, wherein the reaction product has been formed by the two reactants.
Figure 13:
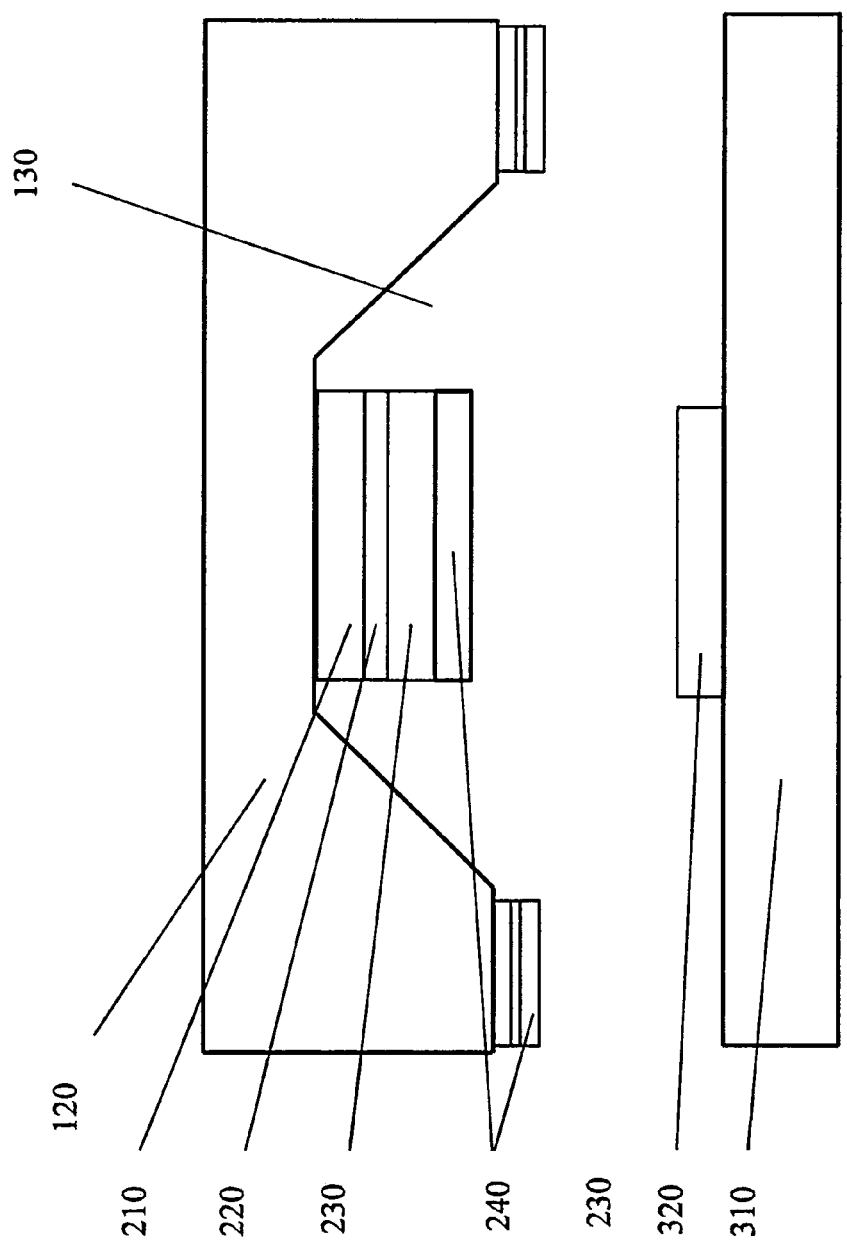
FIG. 13 is a cross sectional diagram illustrating a device encapsulated with the localized heating approach using exothermic reactants.

After etching, the multilayer stack 200 appears as shown in FIG. 11. Material not covered by mask 250 has been removed, leaving only metal layers 1 and 2 under the activable material 240 under mard mask 250. The multilayer stack 200 may now form the bondline for the wafer assembly or it may form the outline of a getter material within the device cavity.

After the activatable material 240 has been patterned as desired and described above, it may be activated. In one embodiment, the exothermic reaction may be initiated by applying current to a current-carrying conductor 210. The current in current-carrying layer 210 may heat the layer 210 through Joule heating. This heat may flow into adjacent layers 220 and 230, and overcome the energy barrier to initiate the exothermic reaction. This energy barrier has kept the reaction in check up to this point, at which it may be overcome. The reaction may proceed between the first reactant and the second reactant. The reaction may produce another product material 225 that is some combination of reactant 1 and reactant 2.

Upon activation, activatable material 240 may change its form from "activable" to "activated". The final, activated form of activatable material 240 may be a cleared, functional getter surface, or it may be a hermetic seal between the lid wafer and the device wafer. In any case, the activated material may alter the environment surrounding the device inside the device cavity, by absorbing contaminant gases for example, or providing a hermetic seal.

Some examples of suitable exothermic reactions may include the following:

$$Fe2O3+2Al \rightarrow 2Fe+Al2O3 \qquad (1)$$

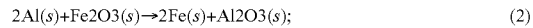

$$2Al(s)+Fe2O3(s) \rightarrow 2Fe(s)+Al2O3(s); \qquad (2)$$

$$3CuO+2Al3Cu+Al2O3 \qquad (3)$$

The heat energy released may be on the order of DH=−850 kJ/mole for reaction (2), and reactions (1) and (3) may have a similar order of magnitude. Using this value for heat generation per mole of reactant, the estimated increase in temperature in the vicinity of the activatable layer 240 may be at least about 200 degrees Fahrenheit, and possibly much higher.

In fact, depending on the magnitude of heat lost to the substrate, the temperature rise may be in the neighborhood of many hundred degrees centigrade. In this case, it may be advantageous to take measures to keep the materials and layers from melting. To control the reaction so that the liquid phase temperature does not rise precipitously or move significantly, a region at one end of a long strip of the reactants may be shaped such that this region heats up first. This shaped structure may be referred to as the activation layer 420, which initiates the exothermic reaction. As previously described, this activation layer 420 may be a permeable magnetic material or a current-carrying conductor. The exotherrmicity will then drive the reaction from this region of the activation layer through the length of the activation layer, the first reactant layer 220 and second reactant layer 230. The activatable material 240 which is deposited on top of these layers 210-230, will then be fired by a sweeping thermal wave, acting much like the process used to purify a Si boule. A method that can preferentially heat one end of the activation layer may consist of patterning one end to be a shape that has a different characteristic lateral dimension than the adjacent region. From a point within this larger area, the exothermic reaction will proceed down the lengths of the multilayer, activating the overlying activatable material.

Figure 14:
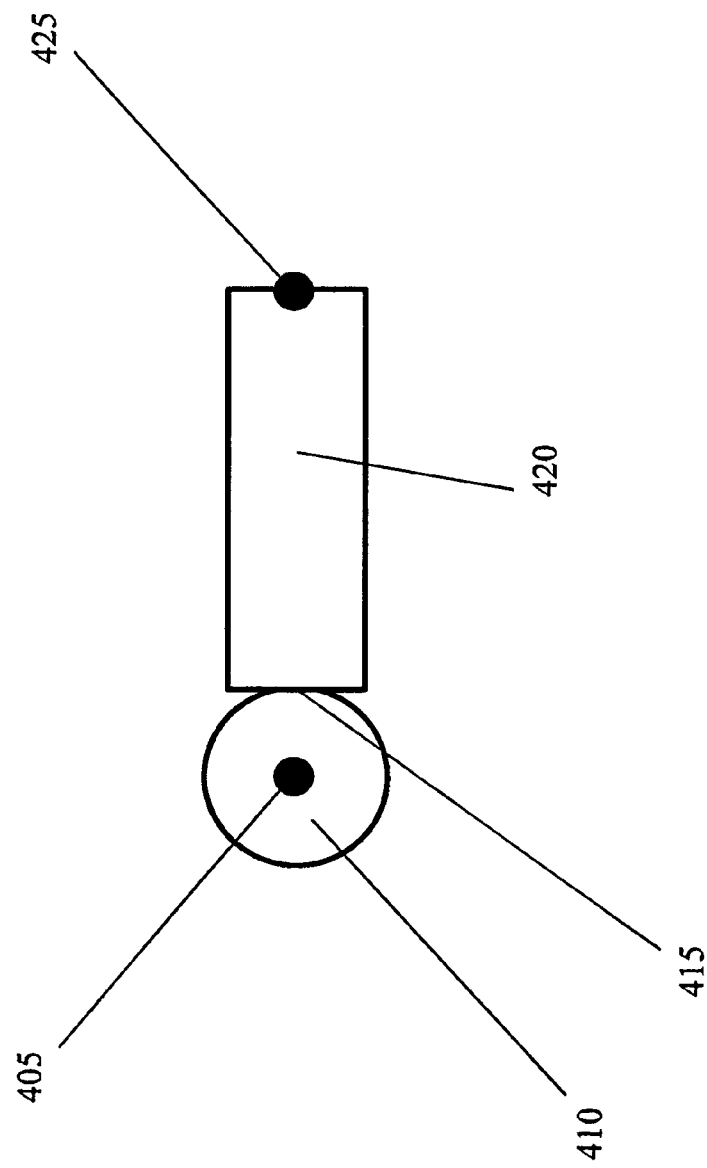
FIG. 14 is cross sectional diagram of a activation layer formed with one region having a larger; ateral extent than an adjacent region.

An example of such a activation layer 420 is shown in FIG. 14. In FIG. 14, a circular area 410 is formed which has a diameter which is larger than an adjacent rectangular area 420. Layers 410 and 420 may be made of a magnetically permeable material as described above wherein one region has a larger extent than an adjacent region. This larger area will permit higher eddy currents to be inductively driven.

Accordingly, the circular area 410 may rise to a higher temperature and initiate the exothermic reaction sooner, than the adjacent rectangular area 420.

Similarly, if the activation mechanism is Joule heating through a current carrying conductor, the current carrying conductor may be shaped to increase the temperature at a specific point by reducing its lateral extent. From a point within one area, the exothermic reaction will proceed rightward as shown, activating an overlying activatable material (not shown in FIG. 14).

If element 410 is a current-carrying conductor, the conductor may be shaped to provide a choke point at which the current density is higher than adjacent areas. In this case, the choke point may rise to a higher temperature that the adjacent region. A choke point 415 is shown in FIG. 14 as the narrow isthmus between the input contact 405 and the output contact 425. The choke point 415 may rise to a higher temperature than the adjacent regions 410 and 420, thus initiating the exothermic reaction at this point.

In general, as the energy is released in a specific location, it will heat that area more than areas which are further from the reaction site. As activatable material 240 is located directly on top of reactant 1 220 and reactant 2 230 and now reaction product 225, it will be heated more so that structures further away from this site, such as the microfabricated device. Accordingly, if activatable material 240 is a getter material, the getter may be activated without heating the entire device 320 within the device cavity 130.

Alternatively, if activatable material is an adhesive bonding material, it may be possible to bond a lid wafer 120 to a device wafer 310, while keeping the device 320 at very low temperatures. By localizing the heat in the vicinity of the activatable material, the material may be activated without damaging, destroying or affecting the device 320.

Although bondlines and getter materials are two specific uses for the application of localized heat generation by exothermic reaction, it should be understood that the techniques may be applied in any situation where a localized source of heat is desired in one portion of a device or device cavity, but not another portion. In addition, an exothermic reaction has been described between two layers of two different reactants, however it should be understood that more reactants may be used, such as three, four or even five different reactants which can form a product in an exothermic reaction may be used.

Figure 15:
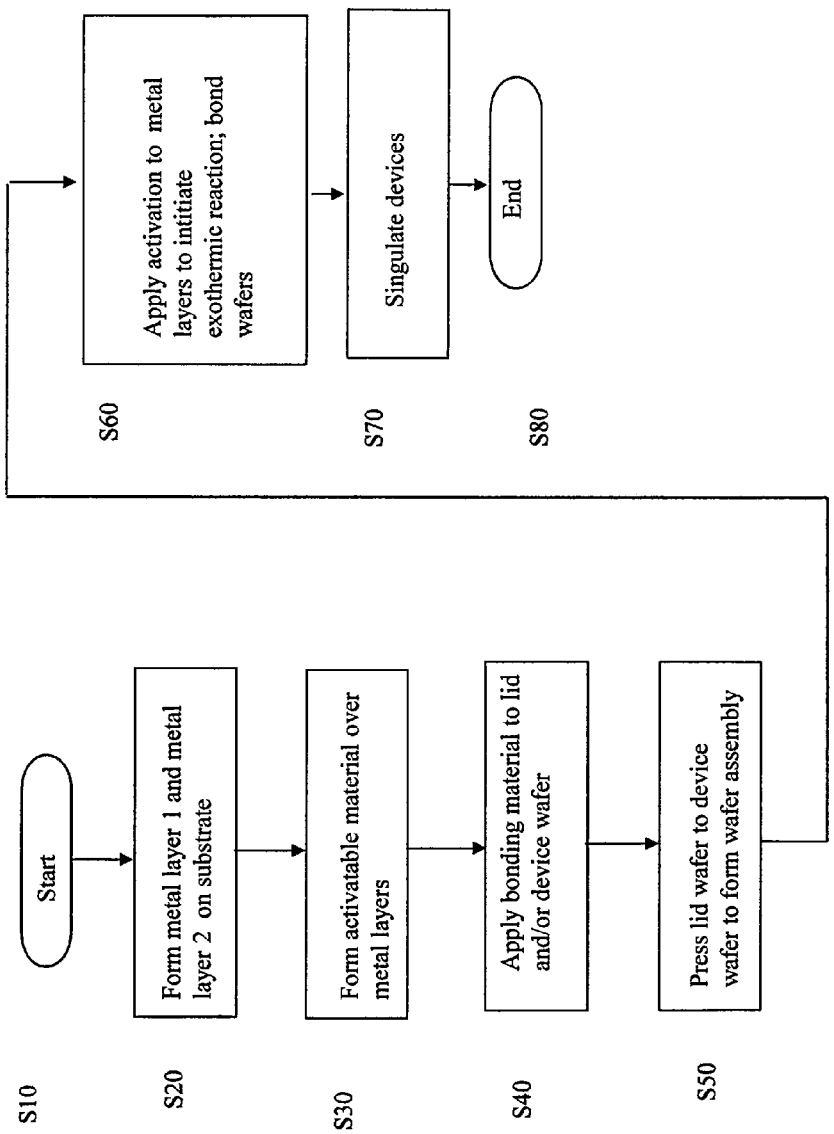
FIG. 15 is flow diagram of an exothermic localized heating method using exothermic reactants.

FIG. 15 is a flow chart illustrating one method of practicing the system and method described herein. The process begins in step S10. In step S20, reactant layer 1 and reactant layer 2 are deposited over a substrate. In step S30, an activatable material is deposited over the two reactant layers. In step S40, na activatable material is deposited on the device wafer and/or lid wafer. In step S50, the lid wafer is bonded to the device wafer. In step S60, the activation mechanism is applied to the reactant layers to initiate the exothermic reaction, and activate the activatable material. In step S70, the encapsulated devices are singulated to separate them from the wafer. The process ends in step S80.

It should be understood that this process is exemplary only, and that steps can be added or omitted, or performed in a different order that that shown without deviating from the scope of this invention. For example, the devices may be singulated before initiating the exothermic reaction. Or the devices need not be singulated at all. Additional layers may be provided in addition to the those specified in the process shown in FIG. 15, such as the multilayer stack described with respect to FIG. 4, above. The layers may be patterned after formation in steps S20 and S30. A cavity may also be formed below the reactant layers in order to thermally isolate the activatable material from the substrate before the lid wafer is bonded to the device layer in step S50.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Furthermore, details related to the specific methods are intended to be illustrative only, and the invention is not limited to such embodiments. It should be understood that the techniques disclosed herein may be applied to any microdevice, including integrated circuits, which may require a vacuum cavity with a getter enclosed therein, for proper functioning. The techniques may also be combined with other wafer bonding technologies, such as fusion bonding rather than metal alloy or glass frit bonding. Accordingly, the exemplary implementations set forth above, are intended to be illustrative, not limiting.

What is claimed is:

1. A device, comprising:
   a first layer of a first reactant formed on a first substrate;
   a second layer of a second product material which includes at least a portion of the first reactant and a second reactant, wherein the first reactant is exothermically reactive with the second reactant to form the second product material;
   a third layer of a third, activated material formed over the second material; and
   a microdevice formed on the first substrate or a second substrate, the microdevice being encapsulated in a device cavity defined by the first substrate and the second substrate, wherein the third material alters the environment surrounding the device inside the device cavity.

2. The device of claim 1, wherein the first reactant comprises aluminum.

3. The device of claim 1, wherein the second product material comprises alumina.

4. The device of claim 2, wherein the third, activated material comprises at least one of a hermetic adhesive material and a getter material.

5. The device of claim 1, further comprising:
   a second cavity disposed in the substrate below the first layer of the first reactant, wherein the cavity is devoid of solid material under a substantial portion of the first layer of the first reactant.

6. The device of claim 4, wherein the adhesive material comprises a metal alloy containing at least two elemental metals in an alloy.

7. The device of claim 6, wherein that at least two metals comprises gold (Au) and indium (In), in a stoichiometry of $AuIn_x$, wherein x is about 2.

8. The device of claim 6, further comprising:
   a second cavity disposed in the substrate under the first layer of the first reactant, wherein the cavity is devoid of solid material under a substantial portion of a surface of the first layer, and wherein the second cavity is in fluid communication with the device cavity.

9. The device of claim 4, further comprising an activation layer disposed underneath the first layer of the first reactant, which applies heats to the first reactant and the second reactant to initiate an exothermic reaction.

10. The device of claim 4, further comprising a current-carrying conductor disposed beneath the first layer, wherein one portion of the current-carrying conductor has a larger lateral dimension than a smaller, adjacent portion of the current-carrying conductor, and further having a choke point between the larger portion and the smaller portion.

11. The device of claim 1, further comprising an activation layer formed beneath the first layer of the first reactant, wherein the activation layer has two contiguous regions, and a lateral extent of one region is greater than a lateral extent of an adjacent region, and wherein the activation layer comprises at least one of a magnetically permeable material and a current-carrying conductor material.

\* \* \* \* \*